United States Patent
Naitoh et al.

(10) Patent No.: US 8,022,383 B2
(45) Date of Patent: Sep. 20, 2011

(54) TWO-TERMINAL RESISTANCE SWITCHING ELEMENT WITH SILICON, AND SEMICONDUCTOR DEVICE

(75) Inventors: Yasuhisa Naitoh, Tsukuba (JP); Yukinori Morita, Tsukuba (JP); Masayo Horikawa, Tsukuba (JP); Tetsuo Shimizu, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 330 days.

(21) Appl. No.: 12/213,054

(22) Filed: Jun. 13, 2008

(65) Prior Publication Data
US 2009/0039330 A1 Feb. 12, 2009

(30) Foreign Application Priority Data
Jun. 15, 2007 (JP) ................. 2007-158101

(51) Int. Cl.
H01L 47/00 (2006.01)
(52) U.S. Cl. ............. 257/4; 257/1; 257/2; 257/E29.111; 257/E29.112; 257/E29.139; 438/775
(58) Field of Classification Search .................. 257/1–4, 257/30, 742–745, E29.002, E29.068, E29.082, 257/E29.083, E29.111, E29.112, E29.139, 257/E29.325, E29.005, E45.001, E47.001; 438/775–777; 427/591–592; 365/148; 327/493
See application file for complete search history.

(56) References Cited

U.S. PATENT DOCUMENTS

| | | | | |
|---|---|---|---|---|
| 7,015,504 | B2 * | 3/2006 | Lyons et al. | 257/40 |
| 7,541,227 | B2 * | 6/2009 | Mei et al. | 438/149 |
| 2006/0278879 | A1 * | 12/2006 | Busta | 257/77 |
| 2009/0251199 | A1 * | 10/2009 | Naitoh et al. | 327/493 |

OTHER PUBLICATIONS

Terabe et al., "Quantized conductance atomic switch," Nature, Nature, vol. 433, 2005, pp. 47-50.
Collier et al, "A [2]Catenane-Based Solid State Electronically Reconfigurable Switch," Science, vol. 289, 2000. pp. 1172-1175.
Naitoh et al., "Resistance switch employing a simple metal nanogap junction, " Nanotechnology, vol. 17, 2006, pp. 5669-5674.

* cited by examiner

Primary Examiner — Matthew Landau
Assistant Examiner — Jessica Hall
(74) Attorney, Agent, or Firm — Birch, Stewart, Kolasch & Birch, LLP

(57) ABSTRACT

A two-terminal resistance switching element, wherein two silicon films each doped with an impurity are arranged with a gap width in the order of nanometers. The gap width is in the range of from 0.1 nm to 100 nm. A semiconductor device can be obtained by providing the two-terminal resistance switching element in a memory, a storage device or other device.

6 Claims, 6 Drawing Sheets

TWO-TERMINAL RESISTANCE SWITCHING ELEMENT WITH SILICON, AND SEMICONDUCTOR DEVICE

FIELD OF THE INVENTION

The present invention relates to a two-terminal resistance switching element in which two silicon films each doped with an impurity are arranged with a nanogap width (i.e. a gap width of nano-sized scale), and to a semiconductor device using the element.

BACKGROUND OF THE INVENTION

At present, the miniaturization of electric elements has been advanced, and as a result, the miniaturization of individual elements has been approaching the limitation thereof. In the case of, for example, CMOSes, which are current leading memory elements, it is expected that the minimum value of their channel length permitting their functions to be expressed would be 6 nm. In order to develop new techniques exceeding this limit, the development of new elements has been advanced on the basis of various ideas throughout the world.

For example, about memory elements, two-terminal resistance switching elements have been researched, in which a large change in resistance is generated between on-states and off-states of the elements through the migration of atoms or a change in property of molecules. Typical examples thereof will be introduced hereinafter.

A technique introduced in Nature 433, (2005) 47-50 is a technique of using an electrochemical reaction between a silver sulfide electrode and a platinum electrode to stretch and shrink silver particles to control, through the silver atoms, the bridging and breaking between the electrodes, thereby realizing an atomic switch.

A technique introduced in SCIENCE 289, (2000) 1172-1175 is a technique of using a redox reaction of catenane-type molecules and inducing the redox reaction of the molecules by a voltage, so as to open a channel, thereby realizing a switching element.

As described above, in recent years, reports have been made on switching elements using the stretching and shrinking of a small number of metal atoms or a redox reaction of molecules.

As illustrated in FIG. 7, the inventors of the present invention proposed a two-terminal resistance switching element in which a voltage is applied to metallic electrodes with a nanogap width across the electrodes (Nanotechnology 17, (2006) 5669-5674). The technique introduced in this literature is a technique of applying a voltage to gold electrodes with a gap width of about 10 nm across the electrodes so as to control the gap width. It is demonstrated that, according to this technique, the resistance value of the gap portion can be controlled and the element can be applied as a non-volatile memory, using the control of the gap width. A resistance change model diagram of a resistance switching phenomenon of the nanogap electrodes is shown in FIG. 2.

However, since metal is used for the electrodes which constitute the element, the technique for working the electrodes is restricted, and further electric characteristics of the electrodes themselves, and others have not been easily controlled.

SUMMARY OF THE INVENTION

The present invention resides in a two-terminal resistance switching element, wherein two silicon films each doped with an impurity are arranged with a gap width in the order of nanometers.

Further, the present invention resides in a semiconductor device which has the two-terminal resistance switching element therein.

Other and further features and advantages of the invention will appear more fully from the following description, appropriately referring to the accompanying drawings.

DETAILED DESCRIPTION OF THE INVENTION

The present invention provides the following means.

(1) A two-terminal resistance switching element, wherein two silicon films each doped with an impurity are arranged with a gap width in the order of nanometers.

(2) The two-terminal resistance switching element according to item (1), wherein the gap width is in a range of from 0.1 nm to 100 nm.

(3) The two-terminal resistance switching element according to item (1) or (2), wherein each of the silicon films is an amorphous silicon film.

(4) A semiconductor device which has the two-terminal resistance switching element according to any one of items (1) to (3).

According to the present invention, silicon, which can be worked in various manners and has electric characteristics of the electrodes themselves that can be very precisely controlled, is used to make it possible to provide a resistance switching element and a semiconductor device which are operated by use of their two terminals.

In other words, according to the present invention, silicon is used for its electrodes, thus, in the case, the manner for working the electrodes, the electric characteristics of the electrodes themselves and the like can be far more precisely controlled than in the case of metallic electrodes. Specifically, when metal is used for electrodes, it is indispensable to change the species of the metal in order to change electric characteristics of the electrodes, however, in the present invention, it is sufficient to adjust the species or the amount of the impurity with which silicon is to be doped. Moreover, in order to work the electrodes, it is sufficient to work only silicon.

Additionally, the whole of the switching element including its substrate can be formed using only silicon. Thus, it becomes easy to produce the resistance switching element and produce a semiconductor device therefrom.

The present invention will be described in detail on the basis of illustrated examples thereof hereinafter. However, the present invention is not limited thereto.

Figure 1:
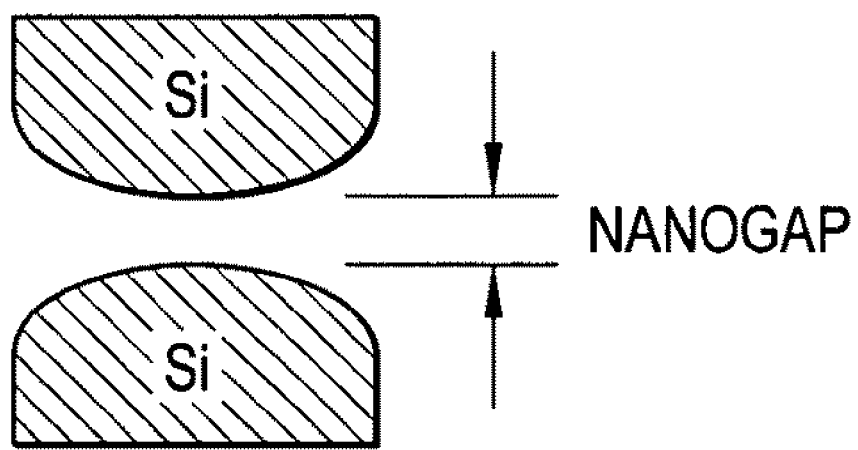
FIG. 1 is a schematic view illustrating an example of a two-terminal resistance switching element according to the present invention.

FIG. 1 is a schematic view of an example of a two-terminal resistance switching element according to the present invention.

Figure 7:
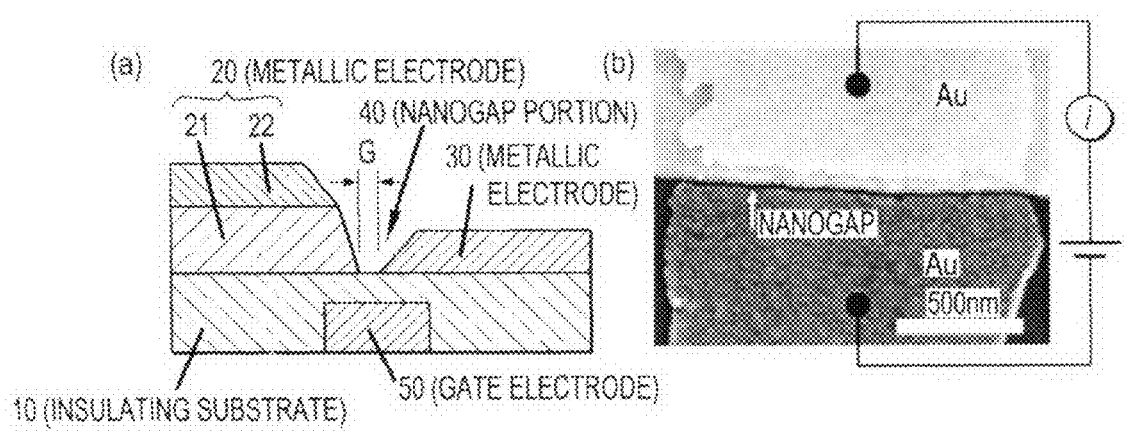
FIG. 7 is a schematic view of nanogap electrodes (a) and an SEM image (b) thereof.
Figure 8:
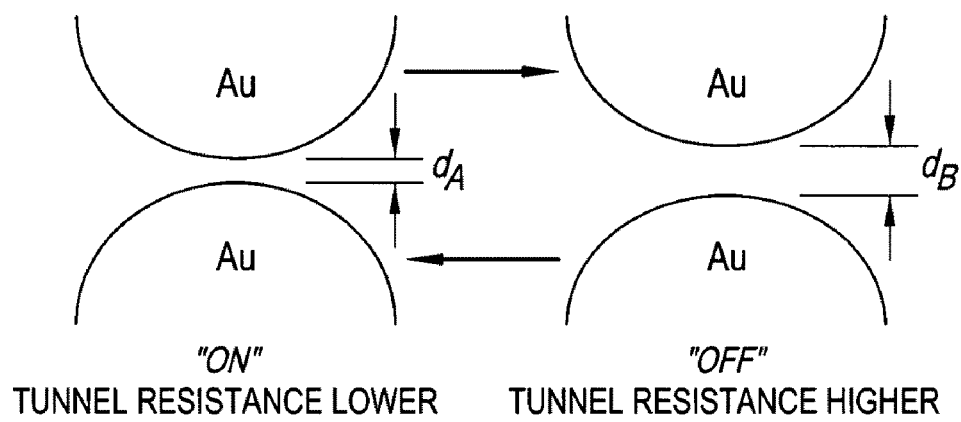
FIG. 8 is a model diagram on resistance change of a resistance switching phenomenon of the nanogap electrodes.

The two-terminal resistance switching element according to the present invention is an element wherein two silicon films each doped with an impurity are arranged with a gap width in the order of nanometers. FIG. 1 illustrates the structure of its operating moiety. This structure needs to be embedded in a different material, or to be evacuated or sealed with an inert gas. A two-terminal resistance switching element of the present invention can be produced, for example, by forming the metal (Au) electrode moieties by silicon (Si) electrodes and keeping the other constitutions unchanged, in the conventional element having nanogap electrodes illustrated in FIGS. 7 and 8.

Figure 2:
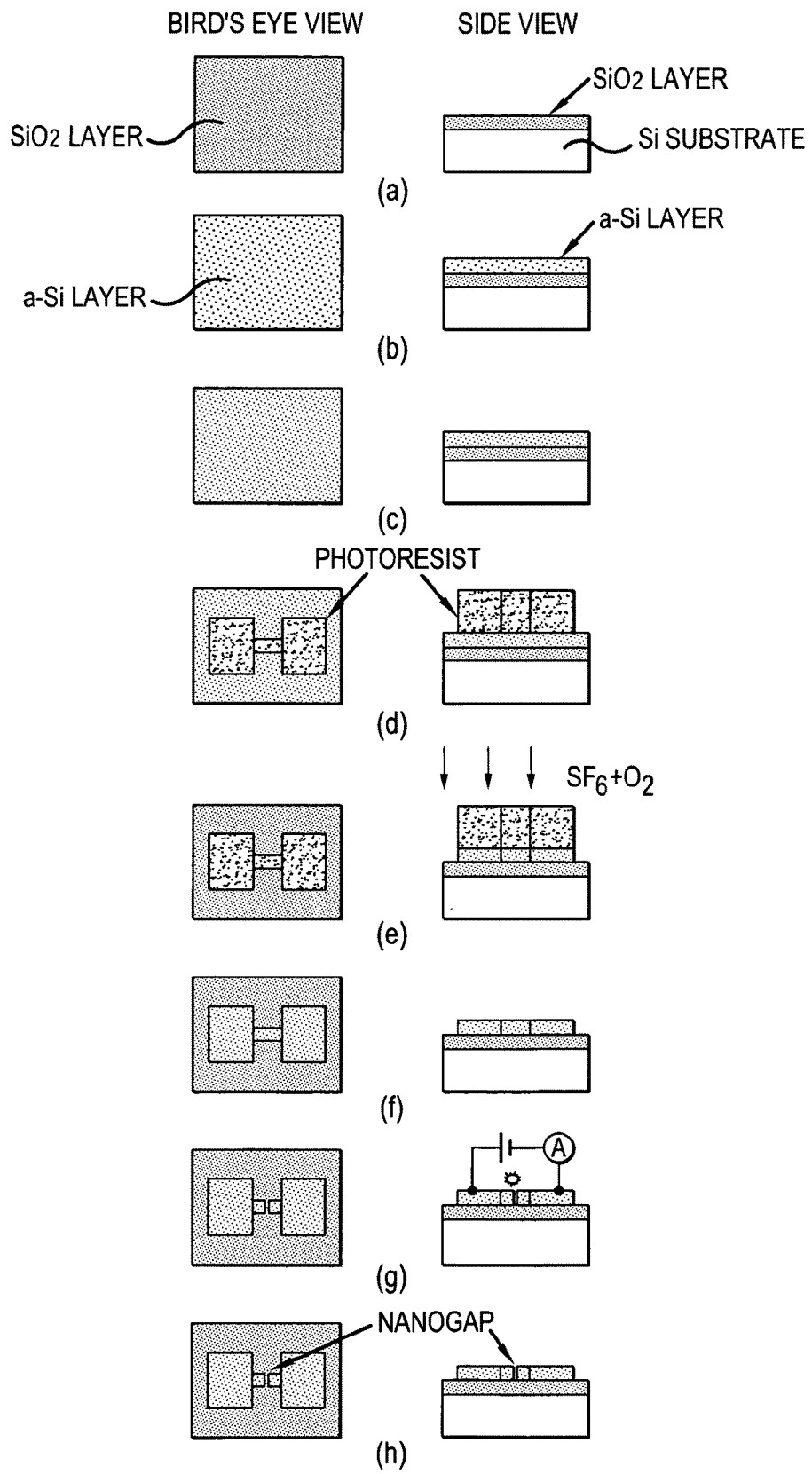
FIG. 2 is a process chart showing an example of the process for producing a two-terminal resistance switching element according to the present invention.

FIG. 2 illustrates an example of the process for producing a two-terminal resistance switching element according to the present invention. In the element the present inventors previously proposed used metal as an electrode material, and the electrodes were formed by vapor deposition. In the present invention, however, the material thereof is silicon, thus, the structure is formed by etching, considering an effect of a surface oxide layer.

A specific example of the process is as follows:
(a) A Silicon oxide ($SiO_2$) layer 300 nm thick is formed on a Si substrate using a thermal oxidation furnace.
(b) An amorphous silicon (a-Si) layer 50 nm thick is formed on the substrate by CVD (chemical vapor deposition).
(c) Phosphorus (P) is ion-implanted at a dose amount of $3 \times 10^{15}$ ion/cm$^2$ into the amorphous silicon layer prepared in the step (b), and then the substrate is annealed to diffuse the implanted P ions.
(d) A resist having a structure of fine lines having a width in the order of micrometers is patterned onto the amorphous silicon layer prepared in the step (c) by photolithography.
(e) The amorphous silicon layer uncovered with the resist is etched by RIE (reactive ion etching).
(f) Lift-off and washing with hydrogen fluoride (HF) are performed.
(g) Inside a vacuum chamber, an electric current is applied to micrometer wires across the wires, thereby causing an electric field breakdown and forming a nanogap with a width in the order of nanometers.
(h) The element comes to completion. (If the width of the nanogap becomes too large after the electric field breakdown so that a switching operation is not caused, a high voltage (about 30 V in a working example) is applied across the electrodes so as to make the gap width small, thereby deforming the structure until the gap width is turned into an operation range.)

The above-mentioned process is an example of the process for obtaining the element of the present invention. Various conditions and others are not limited to the above. For example, the conditions may be changed as follows:

In the step (a), the thickness of the $SiO_2$ layer is not particularly limited, and is preferably from about 1 nm to 1000 nm.

In the step (b), the amorphous silicon (a-Si) layer may be formed by a method other than CVD. For example, the layer may be formed by sputtering. The thickness of the a-Si layer is preferably set into the range of about 1 nm to 500 nm. The a-Si layer may be changed to a layer made of a material other than amorphous silicon as long as the layer is a layer which an impurity can be doped with and which a nanogap can be formed in. For example, single crystal of Si, Ge, SiGe, SiC, GaAs, ZnO, TiOx (x=1~2) or InAs layer may be used.

In the step (c), the impurity with which the amorphous silicon layer is doped may be a substance other than phosphorus (P). For example, As, Sb, B, Al, or Ga may be used. The dose amount of the impurity is preferably from $10^{10}$ ion/cm$^2$ to $10^{17}$ ion/cm$^2$.

In the step (d), the resist may be formed by a method other than photolithography. For example, the resist may be formed by electron beam lithography and nano imprint method.

In the step (e), the etching may be performed by, for example, an wet-etching or ion milling method besides RIE.

The lift-off and the washing in the step (f) may be attained by use of a chemical agent other than hydrogen fluoride (HF). For example, the operations may be attained by use of buffered HF (BHF) or potassium hydroxide (KOH).

In the steps (g) and (h), the width of the nanogap is preferably from 0.1 nm to 100 nm after the electric field breakdown. The width is more preferably from 0.1 nm to 50 nm.

Besides, the individual steps may be performed in accordance with usual methods.

Figure 3:
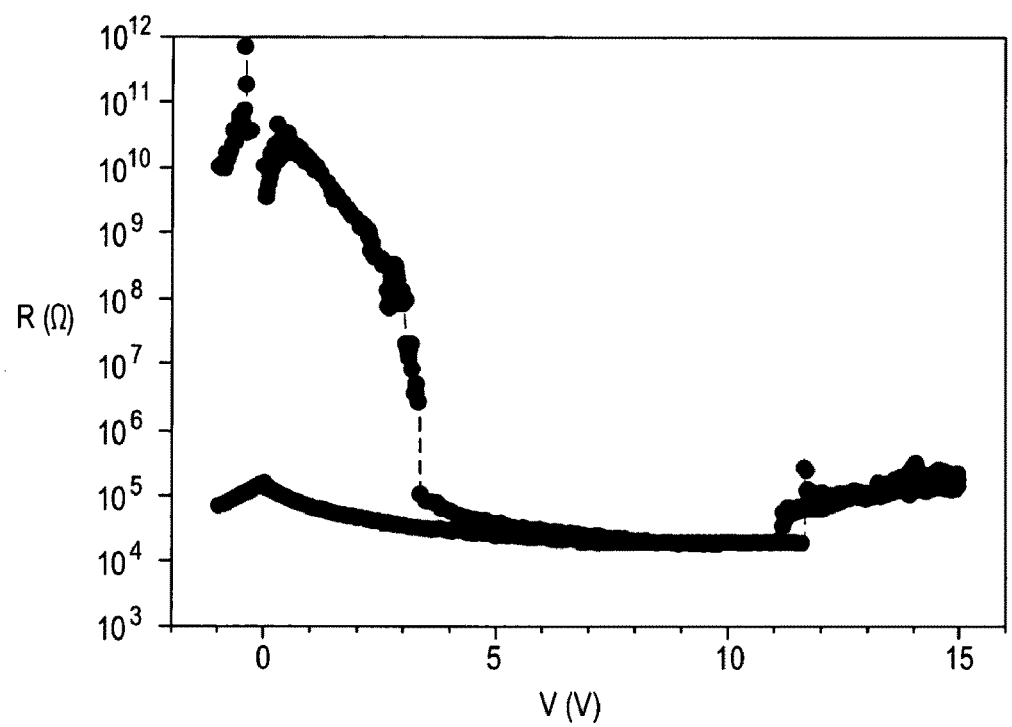
FIG. 3 is a graph showing the resistance-voltage characteristic of a produced sample.

When an electric characteristic of a produced sample was measured in a vacuum, the sample expressed a resistance switching effect as illustrated in FIG. 3 in the same manner as metallic-system samples. It is understood that a large resistance hysteresis was observed at lower bias voltages in this resistance change so that a non-volatile resistance change was expressed.

Figure 4:
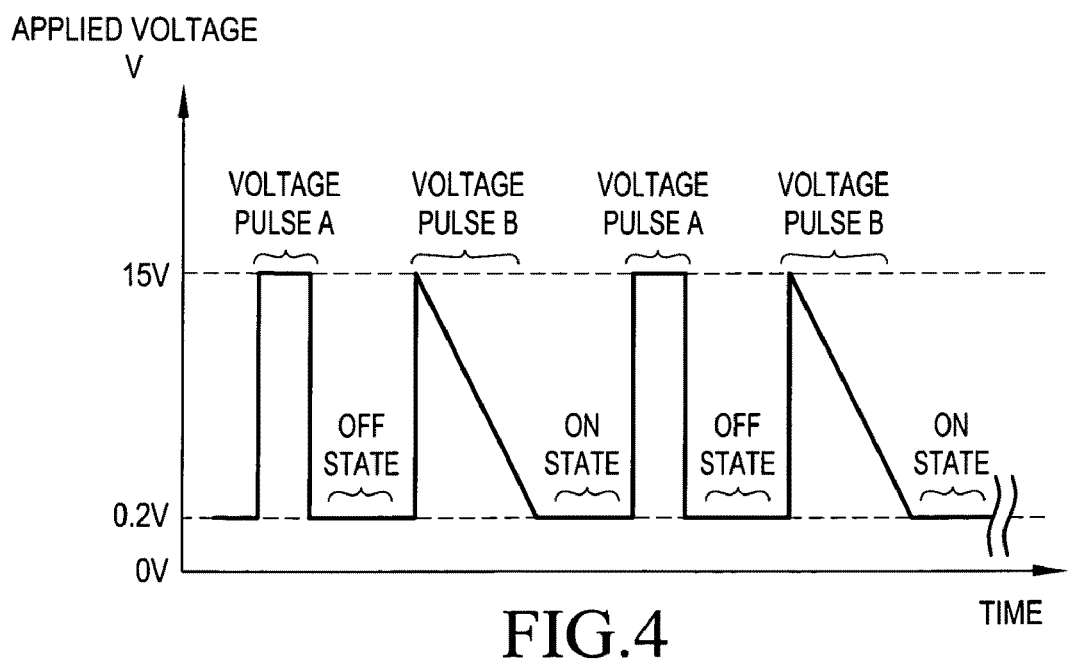
FIG. 4 is a graph showing the waveform of a voltage applied to nanogap electrodes.

When a voltage of a waveform as illustrated in FIG. 4 is applied to a produced element, the resistance state of the element can be freely changed into higher resistances or lower resistances. Specifically, when a voltage is applied to silicon films each doped with an impurity and faced toward each other with a nanogap, an electric switch is realized. When the applied voltage is slowly made from 15 V closer to 0 V, the switch turns on. Reversely, when the applied voltage is instantly made closer to 0V, the switch turns off.

Figure 5:
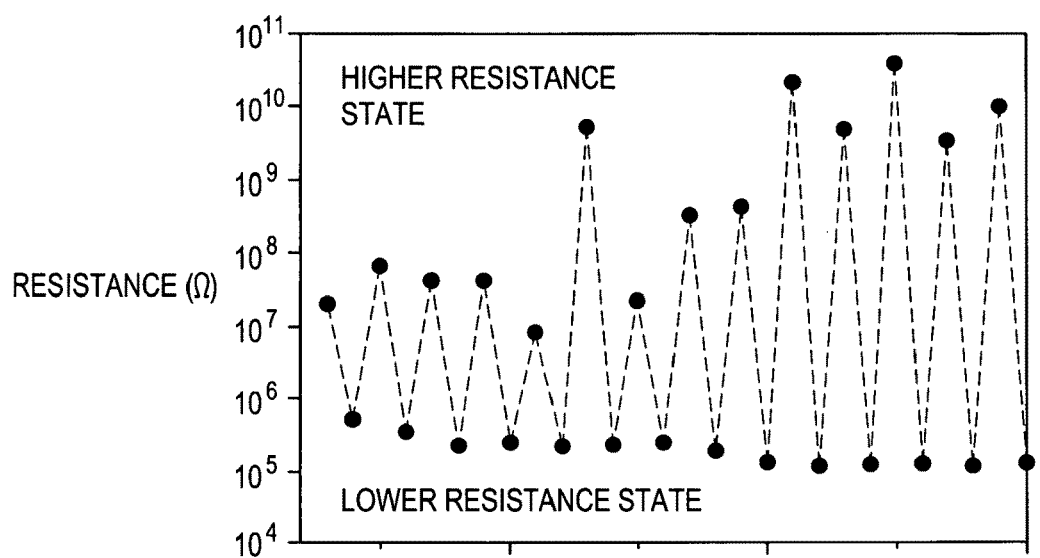
FIG. 5 is a graph showing a recurring characteristic of a non-volatile resistance change of a two-terminal resistance switching element according to the present invention.

FIG. 5 shows the results of the resistance change of the element when the voltage waveform as illustrated in FIG. 4 was applied to the nanogap electrodes. As is understood from FIG. 5, this resistance change shows a reversible change in the same manner as in metallic system electrodes.

Figure 6:
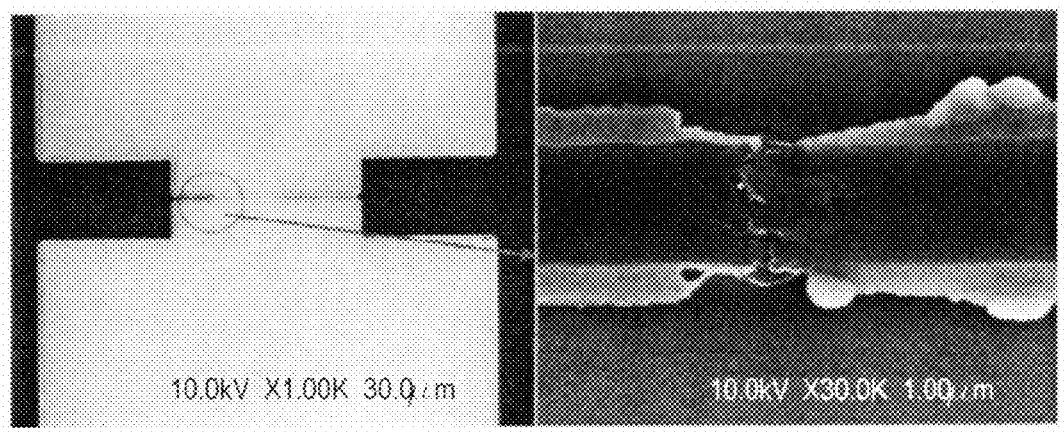
FIG. 6 is SEM images of a two-terminal resistance switching element (the left side image) according to the present invention and the nanogap portion (the right side image) thereof.

FIG. 6 shows photographs of a two-terminal resistance switching element according to the present invention. A nanogap is formed on a Si fine line. In FIG. 6, the right half is an SEM image of the nanogap portion.

Needless to say, a semiconductor device can be obtained by setting a two-terminal resistance switching element of the present invention in a memory, a storage device or some other device. The semiconductor device can be produced by the same method for producing a conventional semiconductor device except that the two-terminal resistance switching element of the present invention is used as a two-terminal resistance switching element. In the metallic system electrodes, a device may be operated through its three terminals, wherein a gate electrode is added to the two terminals. Also in the silicon system electrodes, semiconductor devices each having three or more terminals can be obtained besides semiconductor devices each having the two terminals.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2007-158101 filed in Japan on Jun. 15, 2007, which is entirely herein incorporated by reference.

What we claim is:

1. A two-terminal resistance switching element, comprising two silicon films each doped with an impurity arranged with a gap width in the order of nanometers,
   wherein the switching element gives a resistance hysteresis observed at bias voltages lower than 5V when a voltage is applied to the silicon films, and expresses a non-volatile resistance change.

2. The two-terminal resistance switching element according to claim 1, wherein the gap width is in a range of from 0.1 nm to 100 nm.

3. The two-terminal resistance switching element according to claim 1, wherein each of the silicon films is an amorphous silicon film.

4. The two-terminal resistance switching element according to claim 2, wherein each of the silicon films is an amorphous silicon film.

5. A semiconductor device which has the two-terminal resistance switching element according to claim 1.

6. The two-terminal resistance switching element according to claim 1, wherein the silicon films are patterned by etching in order to provide the gap.

* * * * *